Aug. 23, 1966 J. R. COLE ETAL 3,268,818

SINE WAVE-SQUARE WAVE CONVERTER

Original Filed July 29, 1960 2 Sheets-Sheet 1

INVENTORS
JIMMY R. COLE
ROY E. GARTEN JR.
JOE W. WALTON
BY William J. Miller
ATTORNEY

SINE WAVE-SQUARE WAVE CONVERTER

Original Filed July 29, 1960 2 Sheets-Sheet 2

INVENTORS
JIMMY R. COLE
ROY E. GARTEN JR.
JOE W. WALTON
BY
ATTORNEY

United States Patent Office 3,268,818
Patented August 23, 1966

3,268,818
SINE WAVE-SQUARE WAVE CONVERTER

Jimmy R. Cole, Roy E. Garten, Jr., and Joe W. Walton, Ponca City, Okla., assignors to Continental Oil Company, Ponca City, Okla., a corporation of Oklahoma Continuation of application Ser. No. 46,268, July 29, 1960. This application Jan. 14, 1965, Ser. No. 428,014
5 Claims. (Cl. 328—13)

This is a continuation of applicants' copending application entitled Sine Wave-Square Wave Converter, Serial No. 46,268, now abandoned, filed July 29, 1960.

This invention relates generally to a sine wave to square wave converter and a system for directing current alternately in opposite directions through a load. More particularly, but not by way of limitation, this invention relates to an apparatus for converting electrical signals from a low level sinusoidal function to a high level rectangular function.

It often becomes necessary to convert a low level sinusoidal voltage to a high level square wave voltage which has a corresponding frequency to the sinusoidal voltage. With the increased use of transistors as high current switching devices square wave control signals rather than sinusoidal control signals have become increasingly important. This is evident from the fact that the more rapidly a transistor is switched from cutoff to saturation the less heat is generated by the transition in internal resistance from the maximum cutoff to the minimum value at saturation. On the one hand a sine wave results in a slow transition from cutoff to saturation of the transistor thereby generating an extremly high quantity of internal heat within the transistor itself. On the other hand a square wave results in a rapid transition from cutoff to saturation of the transistor thereby generating an extremely low quantity of heat within the transistor.

The usual way to obtain a square wave from a sine wave is by amplifying and clipping the sine wave by any usual method such is diodes. This method provides a satisfactory square wave unless the rise time must be limited to a small fraction of the on time of the square wave. For a clipper circuit to provide a rapid rise time, the amplified signal must be clipped at a very low voltage. Low level clipping, however, generally proves unsatisfactory, if the amplifier must have a high gain, since the clipped signal will generally be equal to or less than the value of the noise developed by the generator. For example, a ten cycle per second sine wave with a peak amplitude of five millivolts has a rise time of 25 milliseconds. In order to obtain a 4 microseconds rise and fall time, the sine wave must be clipped at approximately the one microvolt level. An output peak of 10 volts, however, would require a $10^7$ gain from the linear amplifier. If the switch network responded to a 2 volt minimum, the input noise level would have to be less than 0.2 of a microvolt. Noise of this level or slightly higher would appear at the output with sufficient amplitude to partially operate the switching network. It is also obvious that if the clipping level is raised to permit the signal to be above the noise of the amplifier, the rise time would suffer thereby causing the switching network to require a longer period of time between saturation and cutoff. The increase in rise time would either result in damage to the switching device or require a larger switching device. Therefore, in order to provide an extremely large gain and yet maintain the signal to noise ratio at level sufficiently low to prevent accidental switching, a low level clipping circuit would require the signal to noise ratio of the source should be more than 25,000 to 1. It is, therefore, desirable to provide a device that will operate with a signal to noise ratio from the source of approximately 5 to 1 with a gain of only 2000 and yet provide a gain which is as effective as the clipping circuit that has a gain of 10 million or more. The device should also be independent of frequency and further prevent noises from causing damage to the switching function.

It is, therefore, an object of this invention to provide an amplifier that will convert a sinusoidal function to a high level rectangular function.

It is a further object of this invention to provide a converter with a signal to noise ratio as low as 5 to 1 which has an effective gain of 10 million or more.

It is a still further object of this invention to provide an extremely short rise and fall time when compared to the on time of the output signal.

It is another object of this invention to provide a converter wherein the rise and fall time is independent of frequency.

It is a still further object of this invention to provide a converter such that low frequency limitation will protect the switching network from transients resulting from an extended input signal duration.

Another object of the invention prevents extraneous noise at the input from damaging the output by converting the noise to a square wave function with the same rise and fall time as the sinusoidal input.

It is a further object of this invention to provide an output amplitude which will remain constant with substantial change in the amplitude of the input signal.

It is a still further object of this invention to limit the transients which may be formed when the source is abruptly cut on and off.

It is a still further object of this invention to draw less average current when the signal is applied than when the signal is removed.

This invention features an input amplifier adapted to amplify a low level sine wave signal, an amplitude clipping circuit which is adapted to accept the amplified input signal and clip it sufficiently to present at its output a substantially squared signal, an inverter stage connected to the output of the clipper stage which provides a first substantially square wave to a first clipper circuit and a second substantially square wave 180° out of phase with the first square wave to a second trigger circuit. When the square wave inputs to the first and second trigger circuits exceed a predetermined threshold, the trigger operates and maintains operation until the positive portion of the input square wave again falls below the threshold. The trigger circuit thus develops a square wave having a rapid rise time which is determined substantially by the input sine wave. Each trigger circuit is followed by a pulse inverter and cathode follower stage, the output of which is connected to the output terminals. The cathode follower stage provides a low impedance output and further provides a signal output which drops from a predetermined positive value to zero, in substantially time synchronism with the positive going portion of the input sine wave.

Other objects, features, and advantages of the invention will become apparent from the following description and claims when read in view of the accompanying drawings, in which:

Figure 1:
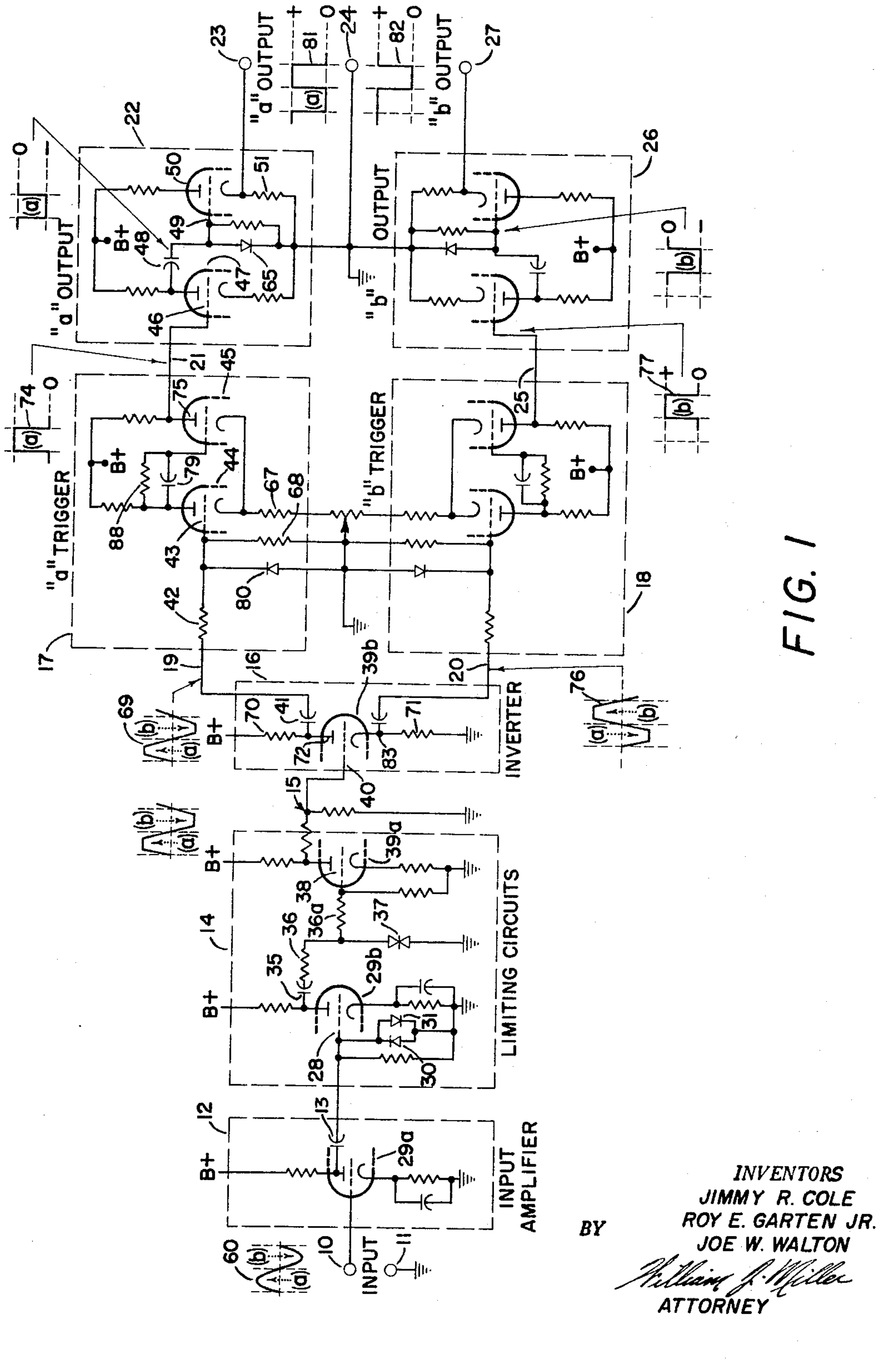
FIG. 1 is a schematic drawing of the sine wave to square wave converter.

Referring to the figures and in particular to FIG. 1, a sine wave to square wave converter is shown which has the following basic components. A pair of input terminals 10 and 11 provides the input means for an input amplifier 12. Input amplifier 12 has its output applied to a pair of limiting circuits 14. The output of the limiting circuits is applied to an inverter 16 which provides an in phase and 180° out of phase signal, as compared to its input, to a pair of trigger circuits 17 and 18. The output of trigger circuit 17 is applied to an output circuit 22, the output of which is applied between a pair of output terminals 23 and 24. The second trigger output 18, likewise has its output connected to an output circuit 26, the output of which is similarly connected between output terminals 27 and 24.

Referring to the pulse amplifier and its components in more detail, input amplifier 12 may be any standard form of amplifier *29a* such as a triode or pentode amplifier. The output from amplifier 12 is capacitively coupled through condenser 13 to a grid 28 of tube 29(*b*) of limiting circuit 14. A pair of diodes 30 and 31 clip or limit the positive and negative portion of the input signal to grid 28. The limited signal is then amplified and applied through a capacitor 35 and a resistor 36 to a diode combination 37 which provides a second stage of limiting or clipping. The signal is then applied to grid 38 of tube portion 39(*a*) where it is amplified and applied through network 15 to grid 40 of tube portion 39(*b*) which comprises the inverter stage of the square wave converter. The inverter 16 provides a signal from its output through a capacitor 41 and resistor 42 to grid 43 of tube 44. Tubes 44 and 45 comprise a trigger circuit of the well known Schmitt type. The output of the Schmitt trigger is applied through wire 21 to the grid 46 of tube 47 which functions as a pulse inverter stage. The output of the pulse inverter stage is applied through a capacitor 48 to grid 49 of cathode follower tube 50. The output of cathode follower 50 appears across resistor 51 and is applied to output terminals 23 and 24. Both trigger 18 and output circuit 26 are identical in structure to trigger 17 and output circuit 22; therefore, the circuit construction will not be discussed.

In operation, a low level sine wave input signal 60 having a positive portion "*a*" and a negative portion "*b*" is applied to the input terminals 10 and 11. The sine wave signal 60 may be generated by any well known form of sinusoidal generator (not shown). Input amplifier stage 12 provides a method for amplifying the sine wave signal. This stage may obviously be eliminated if the low level sine wave signal has sufficient amplitude such that the clipper circuits will have proper operation. Input amplifier 12 also provides a form of isolation between the clipper circuits and the sine wave generator thereby insuring a higher reliability to the circuit. Signal 60 in amplified form is applied to grid 28 of tube 29(*b*). While 29(*b*) and following tubes are shown as portions of other tubes, it is obvious that the circuit is not so limited. The input signal 60, FIG. 2(*a*), when applied to grid 28 has the positive and negative portions of its envelopes clipped by diodes 30 and 31, FIG. 2(*b*). The magnitude of the clipping level is determined primarily by the threshold level of the diodes. A value of 0.4 of a volt is average for most silicon diodes and is used by way of example only. The signal in its clipped form is then amplified by tube portion 29(*b*) and applied to the second clipper circuit which comprises capacitor 35, resistors 36 and 36(*a*) and double anode Zener diode 37. The threshold level of this Zener diode is approximately seven volts, FIG. 2(*c*), thus when the voltage across the Zener diode exceeds seven volts it will conduct and cause an increased voltage drop across resistor 36 and will tend to keep the voltage across diode 37 at a relatively constant voltage. The clipped voltage is subsequently applied through resistor 36(*a*) to grid 38 of amplifier 39(*a*), the output of which is applied to inverter stage 16. Inverter stage 16 is the usual cathode follower inverter having equal resistance for resistors 70 and 71. The signal from the plate 72 is opposite in phase from the cathode 83 and will have the same magnitude as the signal on plate 72 since resistors 70 and 71 are of the same magnitude. Thus, a signal 69 of approximately the same magnitude as the input signal at grid 40 is applied to the input of the Schmitt trigger, hereafter referred to as the "*a*" trigger 17. The "*a*" trigger operates from the "*a*" portion of signal 60 and creates a square wave occurring in time in substantial synchronism with the "*a*" portion of signal 60.

Figure 2:
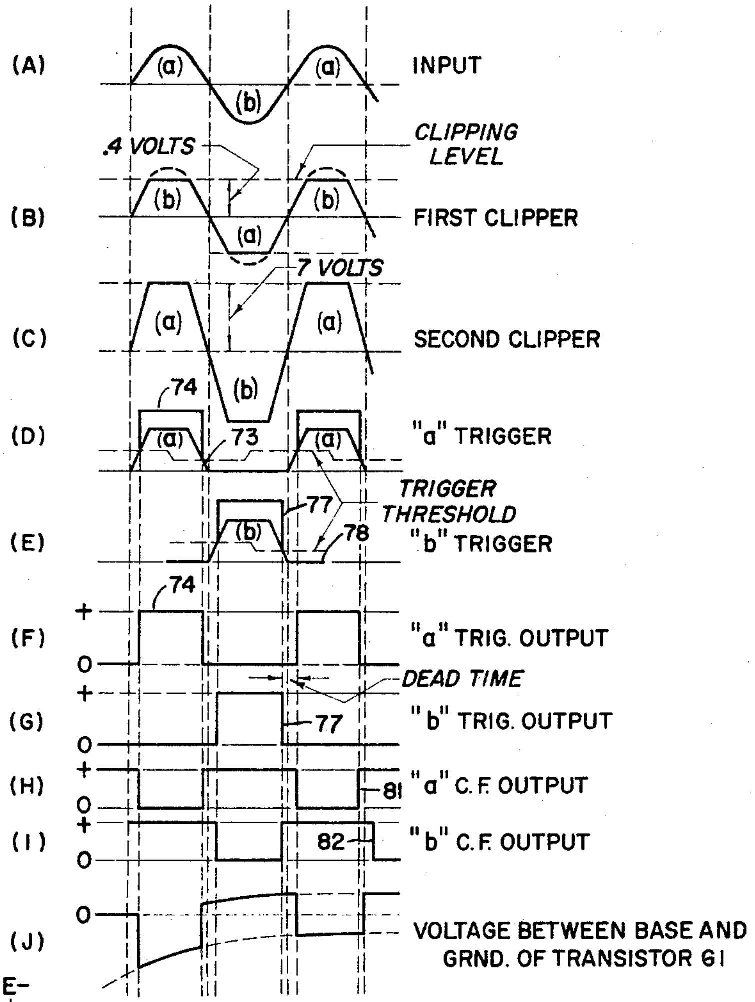
FIG. 2 depicts various circuit in wave forms to illustrate the operation of the device in FIG. 1.

Referring to FIG. 2(*d*), the square wave trigger voltage 73 will increase in value until the threshold level is reached at which time the "*a*" trigger will operate, switching tube 44 from a nonconductive to a conductive state and tube 45 from a conductive to a nonconductive state. As signal 73 continues to increase, the trigger will be maintained in the same state, that is, tube 44 will remain conductive and tube 45 will remain nonconductive. Thus, it is seen that variation in the input trigger level once the trigger reaches the threshold has no effect on the magnitude of the pulse; the magnitude of the pulse being primarily determined by the circuit parameters. A square wave output 74, FIG. 2(*f*), will appear between the plate 75 and ground of tube 45. Diode 80 forms a means for restoring the potential of grid 43.

The input signal 76 to the "*b*" trigger 18 is out of phase by 180° with the input signal 69 to the "*a*" trigger, thus, the "*b*" trigger operates on the negative or "*b*" portion of input signal 60. Since the trigger is designed to operate on a positive going voltage the phase inverters invert the "*b*" portion of the sine wave signal 60. The "*b*" trigger operates identically with that of the "*a*" trigger and therefore will only be generally explained. The output square wave 77, FIG. 2(*e*), is developed when the trigger voltage 78 applied to the grid exceeds the threshold level of the trigger. Upon comparing the output pulses 74 and 77 in FIGS. 2(*f*) and 2(*g*), it is noted that a certain dead time exists between the trailing edge of square wave 74 and the leading edge of square wave 77. This dead time is created by the threshold voltage level of the triggers. The dead time, however, may be minimized by proper selection of resistors 67, 88, and capacitor 79.

Figure 3:
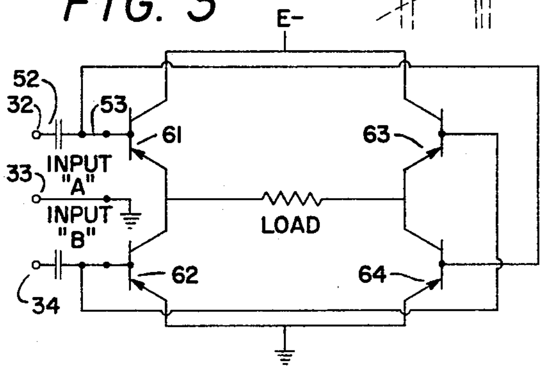
FIG. 3 is a transistorized synchronized converter of the type adapted to be operated by the sine wave to square wave converter shown in FIG. 1.

The output circuit 22 or 26 is specifically designed to operate a PNP type synchronized transistor converter, see FIG. 3. This network comprises four PNP transistors 61, 62, 63, and 64 connected in the form of a bridge. A first input labeled input "*a*" is connected between transistor 61 and transistor 64. A second input "*b*" is connected between transistors 62 and 63. In order to maintain the base of the bridge in a cutoff state with respect to the respective emitters, both inputs "*a*" and "*b*" must be constantly kept at a positive voltage with respect to ground. This will cause the base to be biased higher than the emitter thereby assuring that the transistor is cutoff. If, for example, the voltage at input "*a*" should become negative, transistors 61 and 64 would conduct causing current to flow from ground through transistor 64, through the load, through transistor 61, and through the source of supply E—, and back to ground. If input "*b*" should become negative while input "*a*" was maintained at a positive potential current would flow from ground through transistor 62, the opposite direction through the load, through transistor 63 to the source of supply and thence back to ground. From the foregoing, it is apparent that in order for the device to operate properly either input "*a*" or input "*b*" must be below (negative) ground potential while the remaining input must be positive with respect to ground. Under no conditions can both inputs be negative at the same time.

If the signal from "*a*" output, for example, is supplied to terminals 32 and 33, a voltage will appear between the base 53 and ground of transistor 61 as shown in FIG. 2(*j*). Thus, under normal conditions, the positive voltage appearing between terminals 23 and 24 when applied to input terminal 32 and 33 will cause a positive voltage to appear across capacitor 52. However, since the voltage is D.C., zero voltage will appear between base 53 and ground. When the voltage between terminals 32 and 33 drops to ground potential, the charge on capacitor 52 will appear between the base 53 and ground of transistor 61. This negative voltage, then, is used to operate transistor 61 causing it to go from a cutoff condition to a saturated condition. It is obvious that so long as the signal is being applied to terminals 10 and 11, a square wave will appear at terminals 32 and 33. The voltage between base 53 and ground of transistor 61, however, will gradually stabilize about the ground reference potential, see FIG. 2(*j*). Necessarily, the signal between the base and ground of transistor 61 must always have sufficient negative potential to drive transistor 61 to saturation. It is obvious that a signal applied to input "*b*" will cause the other portion of the bridge to operate in the same manner as a signal when applied to input "*a*" and that the remaining element in the bridge will function accordingly. While a capacitor such as 52 has been shown in the transistor bridge circuit, it may properly be included before the output terminals of the square wave generator, the controlling factor being whether the output voltage from the square wave generator should drop from a positive voltage to zero, or whether the output voltage should be symmetrical about the zero voltage axis.

Since the output from the trigger raises from near zero to a positive potential, inversion is necessary. Tube 47, therefore, provides this function. Thus, a signal 80 is applied from the output of pulse inverter 47 to the input grid 49 of cathode follower 50. Since the cathode of the pulse is in phase with a signal on its grid, the output pulse 81 or 82 is in phase with the input signal resulting in an output signal that drops from a positive value to zero in synchronism with the input signal 60.

Diode 65 also functions as a method of restoring the potential at grid 49. Separate triggers, particularly 17 and 18, are absolutely necessary rather than operating the output stage 22 as a phase inverter. Without the dual trigger stages harmful transients would form. For example, if an inverter stage were considered rather than the dual channels illustrated, a square wave signal applied to a coupling capacitor from the plate to a grid would cause a transient which would for the first few cycles have substantially positive voltage; as the capacitor charged the value of the square wave would gradually reduce until it would be substantially central about the zero axis. However, the few cycles during which time the capacitor is charging would furnish insufficient drive to the pulsing stage since the negative portion of the signal, which cannot pass the coupling capacitor the first few cycles, is used to operate the transistor network. This insufficient drive for the first few cycles would be sufficient to substantially damage the transistors.

One object of the invention was to limit the low frequency output. Because the cathodes are capacitor-coupled to the transistor bridge, it is necessary that the square wave signal which is being applied to the coupling capacitors cannot be differentiated; therefore, the low frequency time constant is increased sufficiently to prevent any differentiation of the input signal to the transistor bridge. This low frequency limitation is provided by proper selection of coupling capacitor 41, resistor 42, and grid leak 68. The differentiation of a long time event at this point restricts the "on" time of the trigger circuit.

Thus, a sine wave to square wave converter has been disclosed which operates on a low signal to noise ratio and has an extremely high gain. It further has a short rise and fall time which is independent of frequency. Proper selection of the components will provide a low frequency limitation on the circuit thereby protecting the switching network from long time transient that may be generated by the pulse. Further, the output amplitude will remain constant with changing input levels. All extraneous noises will be rendered harmless since they will likewise appear at the output in the form of a sharp rise and fall type square wave. Since the "on" time of the system causes the output potential to drop to zero, the system will draw less average current when the signal is applied than with no signal.

It is obvious to those skilled in the art that modifications can be made in the circuit such as the inclusion of transistors in place of the tubes herein disclosed and other modifications which are well within the scope of those skilled in the art.

Although this invention has been described with respect to particular embodiments thereof, it is not to be so limited, as changes and modifications may be made therein which are within the spirit and scope of the invention as defined by the appended claims.

We claim:

1. Apparatus for applying current from a power supply in one direction, and, alternately, in an opposite direction through a load in synchronism with the positive and negative portions, respectively, of a sine wave control signal, comprising:

clipping means having an input connected to receive the sine wave control signal and produce a clipped version of the control signal at the output thereof;

signal inverter means having its input connected to the output of the clipping means and having first and second outputs, said inverter means being responsive to the output of the clipping means for providing an output signal at said first output in phase with the control signal and an output signal at said second output 180° out of phase with the control signal;

first and second Schmitt trigger means, each of said trigger means having an input and an output;

means connecting the input of the first trigger means to the first ouput of the inverter means for producing square wave pulses at the output of the respective trigger means synchronized with the positive portions of the control signal;

means connecting the input of the second trigger means to the second output of the inverter means for producing square wave pulses at the output of the respective trigger means synchronized with the negative portions of the control signal;

a transistor bridge circuit connecting the power supply to the load and having two inputs, said bridge circuit being responsive to a pulse type signal applied to one of the inputs thereof for directing current from the power supply through the load in one direction and being responsive to a pulse type signal applied to the other input thereof for directing current from the power supply through the load in the opposite direction;

means including direct current restoring means connecting the output of the first trigger means to one input of the transistor bridge circuit; and means including direct current restoring means connecting the output of the second trigger means to the other input of the transistor bridge circuit, whereby current from the power supply is directed through the load in one direction in synchronism with the positive portions of the control signal and through the load in the opposite direction in synchronism with the negative portions of the control signal.

2. Apparatus as defined in claim 1 wherein said clipping means includes a diode combination connected across the input of said clipping means and poled to clip both the positive and negative portions of the sine wave control signal, and an amplifier connected to amplify the clipped signal.

3. Apparatus as defined in claim 2 wherein said clipping means further includes a double anode Zener diode connected across the output of said amplifier, and a second amplifier connected to amplify the clipped signal from said Zener diode.

4. Apparatus as defined in claim 1 wherein each of the means including direct current restoring means for connecting the respective Sscmitt trigger means to the respective input of the transistor bridge circuit, comprises:

a pulse inverter circuit having its input connected to the output of the respective trigger means for inverting the pulses produced by the respective trigger means and having an output; and a cathode follower having its input connected to the output of the pulse inverter circuit and having its output connected to the respective input of the transistor bridge circuit for reducing the impedance of the respective pulses transmitted to the transistor bridge circuit.

5. Apparatus for applying current from a power supply in one direction, and, alternately, in an opposite direction through a load in synchronism with the positive and negative portions, respectively, of a sine wave control signal, comprising:

clipping means having an input connected to receive the sine wave control signal which clipping means includes a diode combination connected across the input to said clipping means which is poled to clip both the positive and negative portions of the sine wave control signal, and an amplifier connected to amplify the clipped signal;

a double anode Zener diode connected across the output of said amplifier;

a second amplifier connected to amplify the clipped signal from said Zener diode;

signal inverter means having its input connected to the output of the clipping means and having first and second outputs, said inverter means being responsive to the output of the clipping means for providing an output signal at said first output in phase with the control signal and an output signal at said second output which is 180° out of phase with the control signal;

first and second trigger means, each of said trigger means having an input and an output;

means connecting the input of the first trigger means to the first output of the inverter means to produce first square wave pulses at the output of the respective trigger means synchronized with the positive portions of the control signal;

means connecting the input of the second trigger means to the second output of the inverter means to produce second square wave pulses at the output of the respective trigger means synchronized with the negative portions of the control signal;

first, second, third and fourth PNP-type transistors, each having an emitter, collector and base, and which are connected as a transistor bridge circuit connected to the power supply and to the load;

means capacitively connecting said first square wave pulses to the bases of the first and third transistors;

means capacitively connecting said second square wave pulses to the bases of the second and fourth transistors;

conductor means connecting the source of supply to the collectors of the first and second transistors;

conductor means connecting the emitter of the first transistor and the collector of the fourth transistor to one end of the load;

conductor means connecting the emitter of the second transistor and the collector of the third transistor to the opposite end of the load; and conductor means connecting the emitters of the third and fourth transistors to ground, whereby current from the power supply is directed through the load in one direction in synchronism with the positive portions of the control signal and through the load in the opposite direction in synchronism with the negative portions of the control signal.

References Cited by the Examiner

UNITED STATES PATENTS

| | | | |
|---|---|---|---|
| 2,226,459 | 12/1940 | Bingley | 328—28 |
| 2,721,938 | 10/1955 | Trousdale | 328—29 |
| 2,821,639 | 1/1958 | Bright et al. | 307—88.5 |
| 2,861,239 | 11/1958 | Gilbert | 307—88.5 |
| 3,018,445 | 1/1962 | Stone | 330—13 |
| 3,054,067 | 9/1962 | Merrill et al. | 330—13 |
| 3,095,508 | 6/1963 | Karsh | 307—88.5 |
| 3,205,448 | 9/1965 | Bahrs et al. | 307—88.5 |

FOREIGN PATENTS

| | | |
|---|---|---|
| 226,929 | 5/1958 | Australia. |
| 1,051,324 | 2/1959 | Germany. |

JOHN W. HUCKERT, *Primary Examiner.*

ARTHUR GAUSS, J. D. CRAIG, *Assistant Examiners.*